US010417889B2

(12) United States Patent
Stewart et al.

(10) Patent No.: US 10,417,889 B2
(45) Date of Patent: Sep. 17, 2019

(54) HARD TAG LOCKING CLAMP WITH ENERGY HARVESTING ELEMENT

(71) Applicants: Justin Stewart, Deerfield Beach, FL (US); David Torrecilla, Madrid (ES)

(72) Inventors: Justin Stewart, Deerfield Beach, FL (US); David Torrecilla, Madrid (ES)

(73) Assignee: Sensormatic Electronics, LLC, Boca Raton, FL (US)

( * ) Notice: Subject to any disclaimer, the term of this patent is extended or adjusted under 35 U.S.C. 154(b) by 0 days.

(21) Appl. No.: 15/234,224

(22) Filed: Aug. 11, 2016

(65) Prior Publication Data

US 2017/0046933 A1 Feb. 16, 2017

Related U.S. Application Data

(60) Provisional application No. 62/204,094, filed on Aug. 12, 2015.

(51) Int. Cl.
| | |
|---|---|
| *G08B 13/14* | (2006.01) |
| *G08B 13/24* | (2006.01) |
| *H02K 35/02* | (2006.01) |
| *B81B 3/00* | (2006.01) |
| *E05B 73/00* | (2006.01) |

(52) U.S. Cl.
CPC ........ *G08B 13/2431* (2013.01); *B81B 3/0021* (2013.01); *E05B 73/0017* (2013.01); *G08B 13/2434* (2013.01); *H02K 35/02* (2013.01)

(58) Field of Classification Search
CPC ............ G08B 13/2431; G08B 13/2434; B81B 3/0021; H02K 35/02; H02N 2/186

USPC ...................................................... 340/572.1
See application file for complete search history.

(56) References Cited

U.S. PATENT DOCUMENTS

| 5,367,289 A | 11/1994 | Baro et al. | |
|---|---|---|---|
| 6,373,390 B1 * | 4/2002 | Hogan | ................ E05B 73/0017 340/10.1 |
| 6,535,130 B2 * | 3/2003 | Nguyen | .............. E05B 73/0017 340/571 |
| 7,347,068 B2 * | 3/2008 | Seidel | ................. E05B 73/0064 206/1.5 |

(Continued)

OTHER PUBLICATIONS

PCT International Search Report and Written Opinion of the International Searching Authority (EPO) for International Application No. PCT/US2016/061626 (dated Jan. 20, 2016).

*Primary Examiner* — Tanmay K Shah
(74) *Attorney, Agent, or Firm* — Fox Rothschild LLP; Robert J Sacco; Carol E. Thorstad-Forsyth (57) ABSTRACT

Systems and methods for harvesting mechanical energy in a security tag. The methods involve: applying by a tool a pushing force so as to cause a securement mechanism disposed within the security tag to deform; transferring mechanical energy to a spring sleeve when the securement mechanism deforms due to loading applied by the tool; using an energy harvester (e.g., a piezo element or a magnet/solenoid element) to harness the mechanical energy applied by the tool, where the energy harvester is at least partially coupled to the securement mechanism; and converting the mechanical energy to electrical energy. The energy harvester is disposed between the securement mechanism and an Electronic Article Surveillance ("EAS") or Radio Frequency IDentification ("RFID") component of the security tag.

18 Claims, 9 Drawing Sheets

(56) References Cited

U.S. PATENT DOCUMENTS

| | | | | |
|---|---|---|---|---|
| 7,400,254 B2* | 7/2008 | Yang | ............... | E05B 73/0017 340/541 |
| 7,602,299 B2* | 10/2009 | Valade, Jr. | ............ | E05B 73/0017 340/572.8 |
| 7,633,396 B2* | 12/2009 | Lynce | ............... | E05B 73/0017 340/568.1 |
| 8,051,686 B2* | 11/2011 | Garner | ............... | E05B 17/2015 340/572.1 |
| 8,242,910 B2* | 8/2012 | Skjellerup | ............ | E05B 73/0017 340/568.1 |
| 9,183,718 B2* | 11/2015 | Bergman | ............ | G08B 13/2434 |
| 9,218,730 B2* | 12/2015 | Nguyen | ............ | G08B 13/2434 |
| 2005/0091809 A1* | 5/2005 | Xue | ............... | E05B 73/0017 24/704.1 |
| 2007/0024448 A1* | 2/2007 | Sayegh | ............ | E05B 73/0017 340/572.1 |
| 2007/0205902 A1 | 9/2007 | Cote et al. | | |
| 2010/0148962 A1* | 6/2010 | Nguyen | ............ | E05B 73/0017 340/572.1 |
| 2010/0308998 A1* | 12/2010 | Hesch, Jr. | ............ | E05B 73/0017 340/572.8 |
| 2011/0115632 A1* | 5/2011 | Yang | ............... | G08B 13/1463 340/572.8 |
| 2011/0215156 A1* | 9/2011 | Johnson, II | ............ | H04W 4/02 235/492 |
| 2011/0290889 A1* | 12/2011 | Tamburrini | ......... | G06K 7/10881 235/470 |
| 2012/0032803 A1* | 2/2012 | Copeland | ............ | G08B 13/2417 340/572.1 |

* cited by examiner

HARD TAG LOCKING CLAMP WITH ENERGY HARVESTING ELEMENT

CROSS-REFERENCE TO RELATED APPLICATIONS

The present application claims the benefit of U.S. Provisional Patent Application No. 62/204,094 filed on Aug. 12, 2015. The contents of this Provisional Patent Application are hereby incorporated by reference.

FIELD OF THE INVENTION

This document relates generally to hard tags. More particularly, this document relates to hard tag locking clamps with an energy harvesting element.

BACKGROUND

Hard tags are typically passive devices that contain some element that responds to an external power source when operated properly. The hard tags are incapable of communicating information indicating that they have been detached or unlocked to an external device.

SUMMARY

The present disclosure concerns implementing systems and methods for harvesting mechanical energy in a security tag. The methods comprise: applying by a tool a pushing force so as to cause a securement mechanism disposed within the security tag to deform; transferring mechanical energy to a spring sleeve when the securement mechanism deforms due to loading applied by the tool; using an energy harvester (e.g., a piezo element, a magnet/solenoid element and/or a Micro-Electro-Mechanical-Systems ("MEMS") device) to harness the mechanical energy applied by the tool; and converting the mechanical energy to electrical energy. The energy harvester is at least partially coupled to the securement mechanism. The energy harvester may be disposed between the securement mechanism and an Electronic Article Surveillance ("EAS") or Radio Frequency IDentification ("RFID") component of the security tag.

In some scenarios, the energy harvester comprises a piezo element attached to the spring sleeve of the securement mechanism. The energy harvester detects distortion of the spring sleeve when the securement mechanism is engaged by the tool. Positive and negative leads are attached to the energy harvester. The energy harvester transmits an electrical signal to an electronic component of the security tag (e.g., an EAS component and/or an RFID component).

In some scenarios, the energy harvester comprises a coil and a permanent magnet that is coupled to the securement mechanism. The permanent magnet moves past the coil so as to induce an electrical charge when the securement mechanism rotates as a result of the pushing force being applied thereto. The electrical charge is transferred to an electronic component of the security tag as to indicate that the securement mechanism has been engaged by the tool.

DESCRIPTION OF THE DRAWINGS

The present disclosure will be described with reference to the following drawing figures, in which like numerals represent like items throughout the figures.

DETAILED DESCRIPTION

It will be readily understood that the components of the present solution as generally described herein and illustrated in the appended figures could be arranged and designed in a wide variety of different configurations. Thus, the following more detailed description of various implementations of the present solution, as represented in the figures, is not intended to limit the scope of the present disclosure, but is merely representative of various implementations. While the various aspects of the present solution are presented in drawings, the drawings are not necessarily drawn to scale unless specifically indicated.

The present solution may be embodied in other specific forms without departing from its spirit or essential characteristics. The described solution is to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout the specification may, but do not necessarily, refer to the same embodiment.

Furthermore, the described features, advantages and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

As used in this document, the singular form "a", "an", and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to".

The present disclosure concerns a hard tag. The hard tag comprises an electro-mechanical element incorporated with a locking mechanism. The locking mechanism facilitates the attachment and detachment of the hard tag to an article (e.g., a piece of clothing). The electro-mechanical element provides an electrical response in the event of the hard tag's detachment from the article. In this regard, the electro-mechanical element deforms (i.e., bends) when engaged. The deformation causes the generation of a signal. The signal is sent from the hard tag to an external device. At the external device, the signal is processed so as to provide feedback to a user or data acquisition system indicating that the hard tag has been detached from the article.

Many times a thief or perpetrator will attempt to unlock the hard tag in an authorized manner, defeating the security and purpose of the hard tag. If the thief or perpetrator is successful, (s)he will detach the hard tag from the article, hide the hard tag within a facility, and leave the facility with the article. Consequently, the retailer unknowingly loses this article of inventory. Knowledge of such theft is obtained when the hidden hard tag is later discovered by an employee. By adding a smart element to the hard tag, the hard tag is able to record or notify an external system in the event of a detachment thereof from an article. As such, retailers are able to detect when a thief is maliciously attempting to defeat a hard tag.

Referring now to FIGS. 1-5, there is provided schematic illustrations useful for understanding an exemplary security tag 100. As shown in FIGS. 1-5, the security tag 100 includes a housing 104 with an upper housing member 106 joined to a lower housing member 108. The housing members 106, 108 can be joined together via an adhesive, a mechanical coupling means (e.g., snaps, screws, etc.), or a weld (e.g., an ultrasonic weld). The housing 104 can be made from a rigid or semi-rigid material, such as plastic. The housing 104 has an opening 204 formed therein such that at least a portion of a tack assembly 110 (or attachment element) can be inserted into the security tag for facilitating the attachment of the security tag to an article 114 (e.g., a piece of clothing). EAS and/or RFID components 306 are contained within the housing 104. EAS and RFID components of security tags are well known in the art, and therefore will not be described herein.

Tack assembly 110 has a tack head 112 and an elongate tack body 202 extending down and away from the tack head. The tack body 202 is sized and shaped for insertion into opening 204 and removal from opening 204. A plurality of grooves (not shown in FIGS. 1-5) may be formed along a length of the tack body 202 for engagement with a securement mechanism 206 disposed within the housing 104. When the grooves are engaged by the securement mechanism 206, the security tag 100 is secured to the article 114. Thereafter, unauthorized removal of the article 114 from a controlled area can be detected by a monitoring device of an EAS system. Such monitoring devices are well known in the art, and therefore will not be described herein. Still, it should be understood that at least one sensor (not shown in FIGS. 1-5) is disposed within the housing 104. The sensor includes, but is not limited to, an acoustically resonant magnetic sensor. In all cases, the sensor generates signals which can be detected by the monitoring device.

Such detection occurs when the security tag is present within a surveillance zone established by the monitoring device. The surveillance zone is usually established at an access point for the controlled area (e.g., adjacent to a retail store entrance and/or exit). If the article 114 enters the surveillance zone with the security tag 100, then an alarm may be triggered to indicate possible unauthorized removal thereof from the controlled area. In contrast, if the article 114 is authorized for removal from the controlled area, then the security tag 100 thereof can be deactivated and/or detached therefrom using a detachment mechanism 102 (or external tool). Consequently, the article 114 can be carried through the surveillance zone without being detected by the monitoring system and/or without triggering the alarm.

Figure 1:
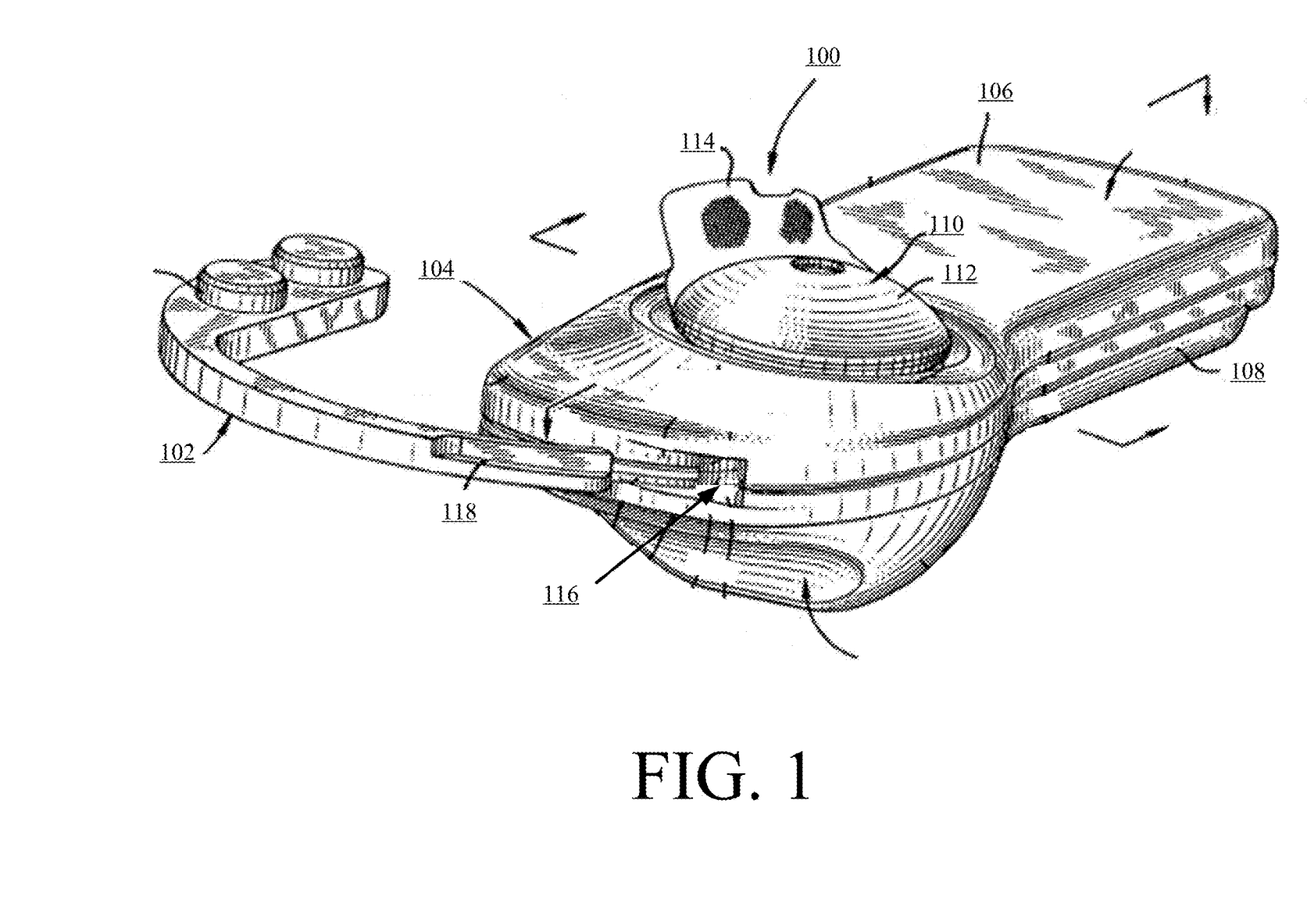
FIG. 1 is a perspective view of an exemplary security tag and detachment mechanism that is useful for understanding the present solution.
Figure 2:
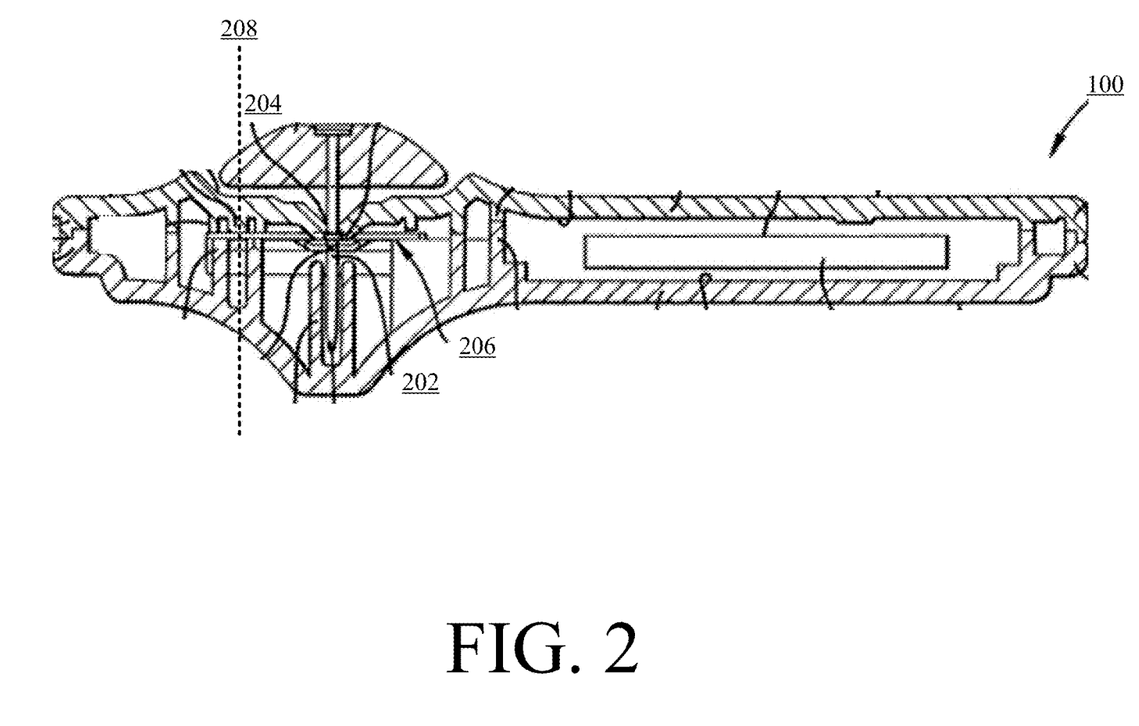
FIG. 2 is a cross sectional side view of the exemplary security tag shown in FIG. 1 that is useful for understanding the present solution.
Figure 3:
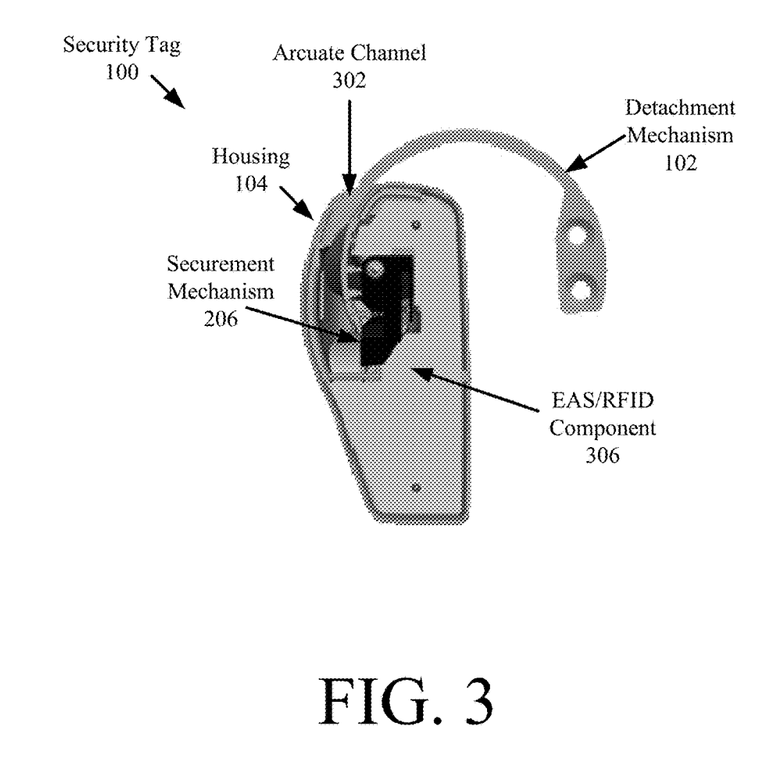
FIG. 3 is an illustration of an exemplary security tag in a locked position.

The detachment mechanism 102 is sized and shaped to at least be partially slidingly inserted into and removed from an insert space 116 formed in the housing 104. When inserted into insert space 116, the detachment mechanism 102 travels through an arcuate channel 302 so as to be guided towards the securement mechanism 206. In this regard, the detachment mechanism 102 has a generally arcuate shape matching that of the arcuate channel 302. Upon engagement with the securement mechanism 206, the detachment mechanism 102 releases the tack body 202 therefrom. Next, the tack body 202 can be removed from the housing, so as to decouple the security tag 100 from the article 114.

Figure 4:
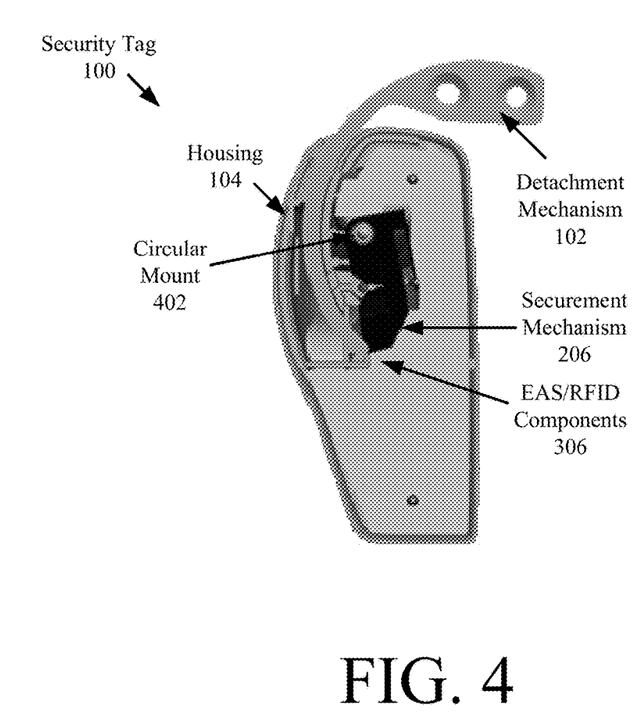
FIG. 4 is an illustration of an exemplary security tag in an unlocked position.
Figure 5:
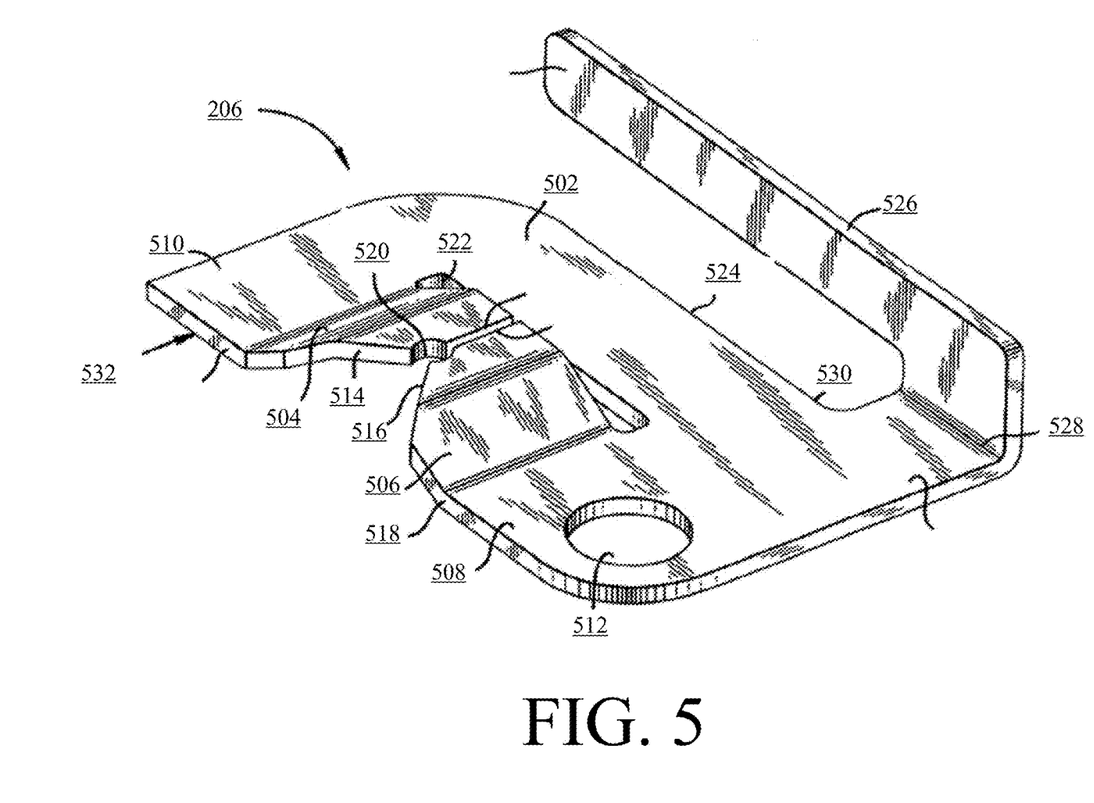
FIG. 5 is a perspective view of a securement mechanism of the security tag shown in FIG. 1.

A schematic illustration of the securement mechanism 206 is provided in FIG. 5. As noted above, the securement mechanism 206 is specifically adapted to accommodate release of the tack body 202 via the detachment mechanism 102 (or arcuate probe) moving in the arcuate channel 302. The securement mechanism 206 is generally in the form of a spring clamp securely disposed within the housing 104 of the security tag so as to be pivotable (or rotatable) about an axis 208. In this regard, the spring clamp comprises a clamp body 502 and jaws 504, 506. The clamp body 502 includes a mounting part 508 extending laterally of jaw 506 and a release part 510 extending laterally of jaw 504. The mounting part 508 includes a mounting aperture 512 facilitating the pivotable movement of the securement mechanism 206 within the housing of the security tag. The pivotable movement allows the securement mechanism 206 to be transitioned by the detachment mechanism 102 (or arcuate probe) from a first position in which the tack assembly is locked thereto (as shown in FIG. 3) and a second position in which the tack assembly is released or unlocked therefrom (as shown in FIG. 4).

Each of the jaws 504, 506 extends outwardly of the plane of the clamp body 502 and then inwardly toward the other jaw. The jaws 504, 506 terminate in facing edges 514, 516. These edges extend from a common edge 518 of the clamp body 502 inwardly toward each other, then curve outwardly away from each other to define an aperture 520 (typically, circular or elliptical) for receiving the tack body 202. The edges 514, 516 then continue in aligned fashion and end in an elongated, lateral slot 522 in the clamp body 502. The lateral slot lies inward of a further clamp body edge 524 which opposes the clamp body edge 518.

A further laterally extending elongated spring sleeve 526 is attached by a joint area 528 to the side 530 of the edge 524 bordering the mounting part 508. The sleeve 526 extends along the length of the edge 524 and is also out of the plane of the clamp body 502.

For mounting and supporting the spring clamp 502, the lower housing member 108 of the security tag 100 includes a circular mount 402. The spring clamp 302 is mounted, via aperture 312 of the mounting part 308, on the circular mount 402. In this way, the mounting part 508 can be rotated about the circular mount 402. The spring clamp 502 is thus able to pivot about the mounting part 508.

When an end of the tack assembly 110 is introduced in the downward direction through the opening 204 in the upper housing member 106, the tack body 204 is directed to aperture 520 of the securement mechanism 206. This causes the jaws 504, 506 to spread open and allow the tack body 204 to pass there through.

When the downward movement of the tack assembly 110 is stopped, the jaws 504, 506 retract and clutch the tack body 204. In this position, the jaws 504, 506 prevent upward movement of the tack assembly 110. As such, the security tag 100 becomes securely coupled to the article 114.

In order to release the tack body 204 from the jaws 504-306, the detachment mechanism 102 is introduced into the insert space 116 formed in the housing 104 of the security tag 100. Rotation of the detachment mechanism 102 causes it to be moved in and guided by the arcuate channel 302 until the end 118 abuts portion 532 of the securement mechanism 206. Continued rotational movement of the detachment mechanism 102 causes force to be applied to portion 532 of the securement mechanism 206. This force, in turn, causes the clamp body 502 to rotate about the support area 508. The jaw 504 is thus enabled to spread away from jaw 506 due to the force of the tack body 204, which is being held stationary by jaw 506. As a result, aperture 520 expands, releasing the tack body 204 from the clutch of the jaws. The tack assembly 110 can now be moved in the upward direction past the jaws, via an upward force on the tack head 112.

During rotation of the clamp body 502, the spring sleeve 526 at the joint area 528 is compressed. After the tack assembly 110 is separated from the housing 104, the detachment mechanism 102 is rotated in the reverse direction. This reverse rotation disengages the detachment mechanism 102 from the securement mechanism 206. Consequently, the spring sleeve 526 rotates in an opposite direction so as to be brought back to its original position. Thereafter, the detachment mechanism 102 is guided out of the arcuate channel 302 and is removed from insert space 116 formed in the housing 104.

As evident from the above discussion, the detachment mechanism 102 is provided to deflect the securement mechanism 206 so as to allow the tack assembly 110 to be removed from the housing 104. The detachment mechanism 102 may be part of an external detacher. Detachers are well known in the art, and therefore will not be described herein. When the tack assembly 110 is removed from the housing 104, the security tag 100 can be decoupled from an article 114 (e.g., a piece of clothing).

The deflection of the securement mechanism 206 results from an application of mechanical energy by the detachment mechanism 102. The present invention provides a means for harnessing the applied mechanical energy. The means includes an additional element disposed between the securement mechanism and EAS/RFID component(s). The additional element can include, but is not limited to, a piezo (or piezoelectric) element, a magnet/solenoid element, and/or a MEMS device.

Figure 6:
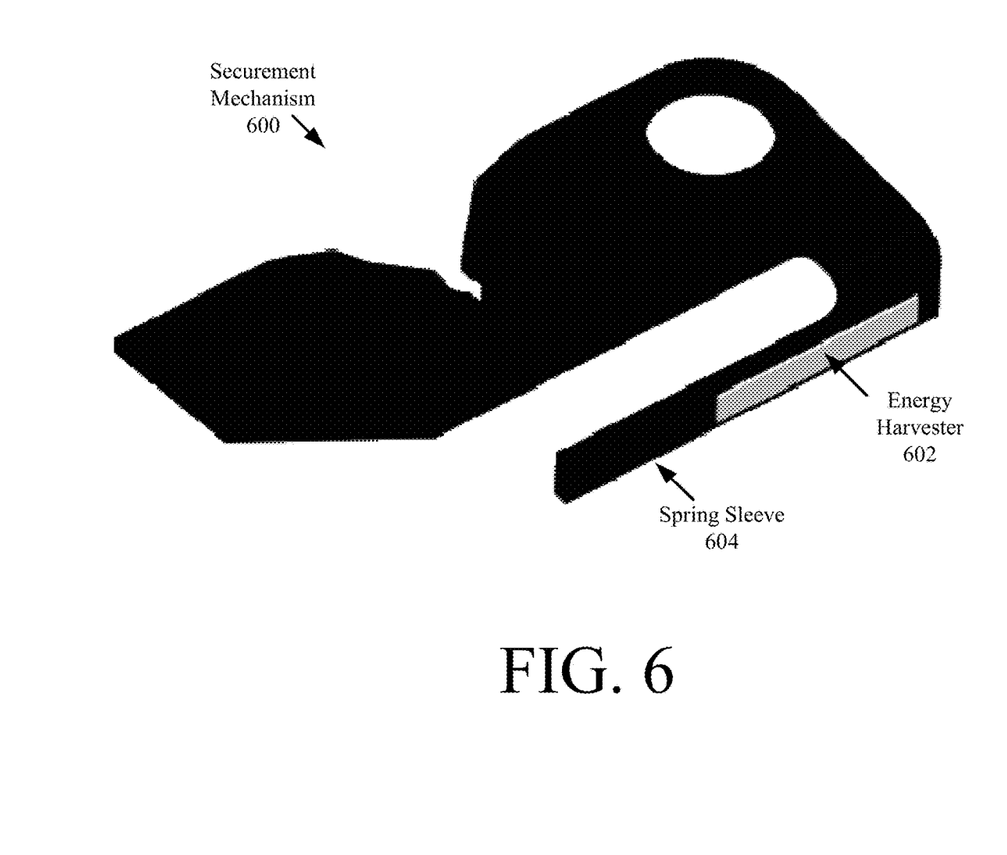
FIG. 6 is an illustration of a securement mechanism having an energy harvester coupled thereto.

Referring now to FIG. 6, there is provided a schematic illustration of a securement mechanism 600. The securement mechanism 600 is similar to or the same as securement mechanism 206 of FIG. 5. As such, the discussion provided above in relation to securement mechanism 206 is sufficient for understanding securement mechanism 600. Unlike securement mechanism 206, securement mechanism has an energy harvester 602 coupled thereto for harnessing the applied mechanical energy.

Figure 8:
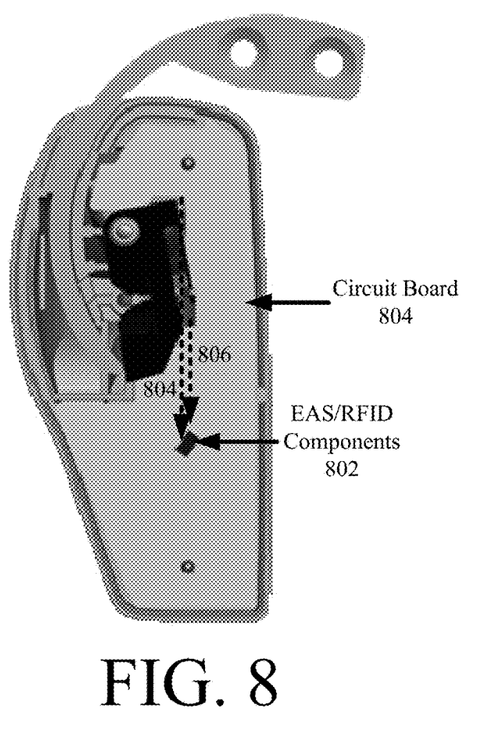
FIG. 8 is an illustration of another exemplary security tag having an energy harvester for harnessing the applied mechanical energy.

The energy harvester 602 includes, but is not limited to, a piezo or piezoelectric element that is able to generate an electric charge in response to applied mechanical stress. The energy harvester 602 is attached to the spring sleeve 604 of the securement mechanism 600. When the securement mechanism 600 deforms due to loading applied by a detachment mechanism (e.g., detachment mechanism 102 of FIG. 1), mechanical energy is transferred to the spring sleeve 604. As such, the energy harvester 602 detects distortion of the spring sleeve 604 when the securement mechanism 600 is engaged by the detachment mechanism. The mechanical energy provided by the detected distortion of the spring sleeve 604 can be converted to electrical energy. The spring sleeve's distortion is shown in FIGS. 4 and 8. This distortion comprises a bending of at least a portion of the spring sleeve. In other scenarios, the spring sleeve may remain perfectly elastic. In both cases, the behavior of the spring sleeve is analyzed for generating an electrical signal. The spring sleeve may be configured for a one time use event or a multiple use event.

Figure 7:
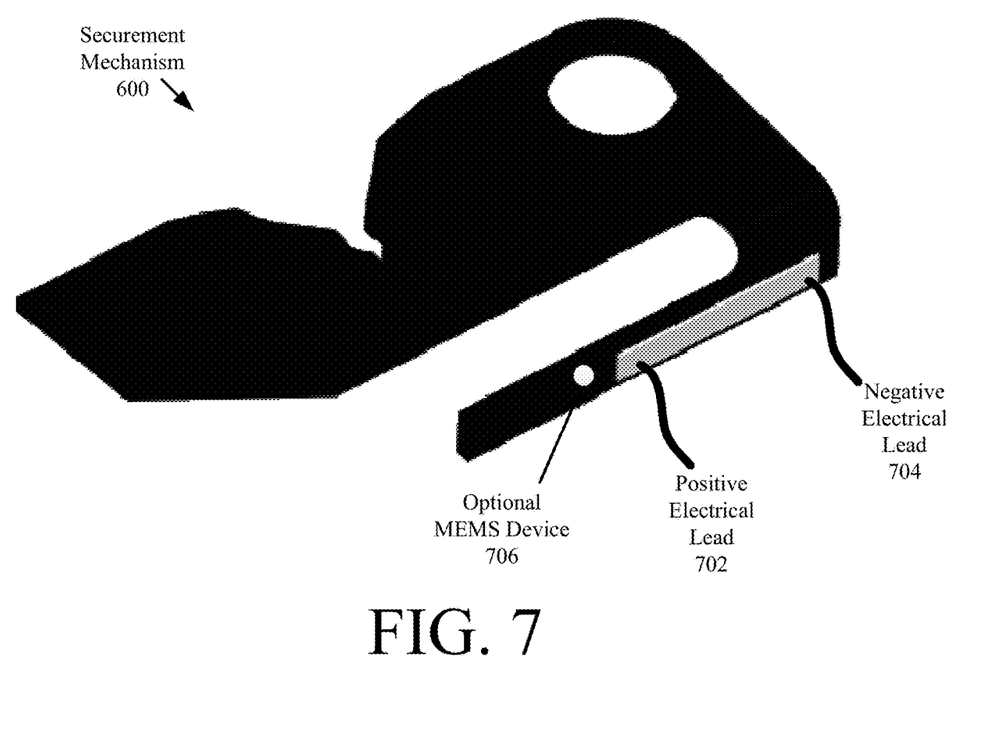
FIG. 7 is an illustration of showing the energy harvester of FIG. 6 coupled to positive and negative electrical leads.

In this regard, positive and negative leads 702, 704 can be attached to the energy harvester 602 as shown in FIG. 7. When the leads 702, 704 are attached to the energy harvester 602, the energy harvester 602 can transmit an electrical signal to another object, such as a microprocessor of the EAS/RFID component(s) 802 shown by arrows 804 and 806 of FIG. 8. The leads 702, 704 are electrically coupled to the EAS/RFID component(s) 802 via wires and/or traces disposed on or in a circuit board 804. The wires and/or traces are not visible in FIG. 8.

When the electrical signal is applied to the EAS/RFID component(s) 802, it generates and transmits a notification signal to an external device (e.g., an EAS pedestal, RFID reader and/or a user or data acquisition system). This notification provides an indication that the hard tag has been detached from the article. The notification may also comprise information specifying an area or zone within a facility where the hard tag resides after being detached from the article. In effect, a user (e.g., retail personnel) is able to make a quick and informed decision as to whether a potential theft is taking place.

In some scenarios, a MEMS device 706 is provided in addition to the piezo element. The MEMS device 706 may be coupled to the spring sleeve 604 as shown in FIG. 7 or disposed on a circuit board 804. In both cases, the MEMS device 706 is connected in series between the energy harvester 602 and the EAS/RFID component(s) 802. The MEMS device 706 is generally configured to process the electrical signal generated by the piezo element for increasing or converting power so as to increase the efficiency of electric power transfer.

The present solution is not limited to the particulars of FIGS. 6-8. Means other than the piezo element may be employed for harnessing the applied mechanical energy. For example, the piezo element 602 may be replaced with a MEMS device. In this case, the MEMS device would detect deformation of the spring sleeve and generate an electrical signal in response to the detected deformation. The electrical signal would be provided from the MEMS device to the EAS/RFID component(s) 802.

MEMS devices are well known in the art, and therefore will not be described herein. Any known or to be known MEMS sensor can be used here without limitation provided that it can: (a) process the electrical signal generated by the piezo element for increasing or converting power so as to increase the efficiency of electric power transfer; or (b) detect deformation of the spring sleeve and generate an electrical signal in response to the detected deformation.

Figure 9:
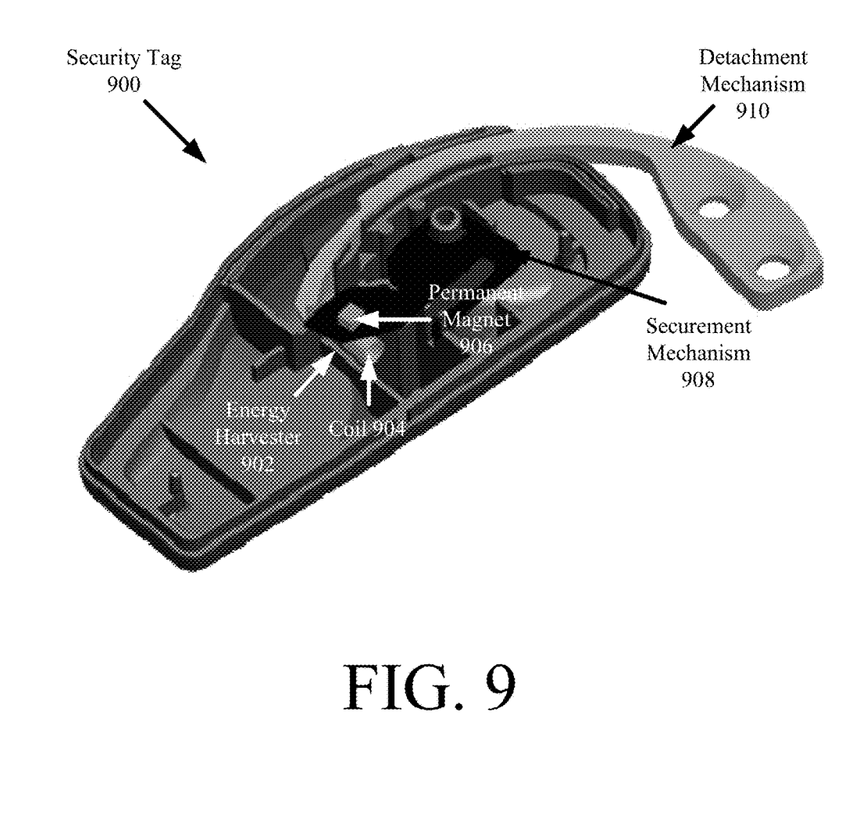
FIG. 9 is an illustration of another exemplary security tag having an energy harvester for harnessing the applied mechanical energy.

Referring now to FIG. 9, there is provided an illustration of another exemplary security tag 900 having an energy harvester 902 for harnessing the applied mechanical energy. The energy harvester 902 comprises a coil 904 and a permanent magnet 906. The permanent magnet 906 is coupled to the securement mechanism 908. When the securement mechanism 908 rotates, the permanent magnet 906 moves past the coil 904, thereby inducing a small electrical charge. The electrical charge can then be transferred to the EAS/RFID component(s) (not shown in FIG. 9 for clarity of the energy harvester's illustration) so as to indicate that the securement mechanism 908 has been engaged by a detachment mechanism 910 or other detachment tool.

When the electrical charge is transferred to the EAS/RFID component(s), it generates and transmits a notification signal to an external device (e.g., an EAS pedestal, RFID reader and/or a user or data acquisition system). This notification provides an indication that the security tag 900 has been detached from the article. The notification may also comprise information specifying an area or zone within a facility where the security tag 900 resides after being detached from the article. In effect, a user (e.g., retail personnel) is able to make a quick and informed decision as to whether a potential theft is taking place.

In some scenarios, the security tag 900 also comprises a MEMS device (not shown in FIG. 9 for clarity of the energy harvester's illustration) for improving the efficiency of electrical charge. The MEMS device is disposed on a circuit board (not shown in FIG. 9 for clarity of energy harvester's illustration) so as to be connected in series between the energy harvester 902 and the EAS/RFID component(s). The MEMS device is generally configured to process the electrical signal generated by the energy harvester 902 for increasing or converting power so as to increase the efficiency of electric power transfer.

The present solution is not limited to the particulars of FIG. 9. For example, a MEMS device may replace the coil 904. In this case, the MEMS device generates an electrical signal when the spring sleeve deforms (i.e., bends) and transfers the electrical signal to the EAS/RFID component(s).

MEMS devices are well known in the art, and therefore will not be described herein. Any known or to be known MEMS sensor can be used here without limitation provided that it can: (a) process the electrical signal generated by the energy harvester for increasing or converting power so as to increase the efficiency of electric power transfer; or (b) generates an electrical signal when the spring sleeve deforms (i.e., bends) and transfers the electrical signal to another device.

Notably, the present invention is not limited to the particulars of the above-described exemplary architectures. For example, the security tag may comprise an active tag having an internal power source. In this case, a sensor may be coupled to an internal housing sidewall at a position suitable for monitoring and detecting movement of a securement mechanism by an external tool. The sensor can include, but is not limited to, a light sensor or a through beam sensor. The securement mechanism can include, but is not limited to, a clamping mechanism or a magnetic post/spring mechanism. The external tool can include, but is not limited to, a magnet or a probe. Accordingly, the present invention covers a plurality of different mechanical, electrical and electro-mechanical mechanisms that can detect movement of a securement mechanism and provide notification of such movement to a remote computing system.

All of the apparatus, methods, and algorithms disclosed and claimed herein can be made and executed without undue experimentation in light of the present disclosure. While the invention has been described in terms of preferred embodiments, it will be apparent to those having ordinary skill in the art that variations may be applied to the apparatus, methods and sequence of steps of the method without departing from the concept, spirit and scope of the invention. More specifically, it will be apparent that certain components may be added to, combined with, or substituted for the components described herein while the same or similar results would be achieved. All such similar substitutes and modifications apparent to those having ordinary skill in the art are deemed to be within the spirit, scope and concept of the invention as defined.

The features and functions disclosed above, as well as alternatives, may be combined into many other different systems or applications. Various presently unforeseen or unanticipated alternatives, modifications, variations or improvements may be made by those skilled in the art, each of which is also intended to be encompassed by the disclosed embodiments.

We claim:

1. A method for harvesting mechanical energy in a security tag, comprising:
   applying by a tool a pushing force so as to cause a securement mechanism disposed within the security tag to deform;
   transferring mechanical energy to a spring sleeve when the securement mechanism deforms due to loading applied by the tool;
   using an energy harvester to harness the mechanical energy applied by the tool, where the energy harvester is at least partially directly coupled to the securement mechanism; and
   performing operations by the energy harvester to convert the mechanical energy to electrical energy;
   wherein the energy harvester comprises at least one of a piezo element, a magnet/solenoid element, and a Micro-Electro-Mechanical-Systems ("MEMS") device.

2. The method according to claim 1, wherein the energy harvester is disposed between the securement mechanism and an Electronic Article Surveillance ("EAS") or Radio Frequency IDentification ("RFID") component of the security tag.

3. The method according to claim 1, wherein the energy harvester comprises a piezo element attached to the spring sleeve of the securement mechanism.

4. The method according to claim 1, wherein the energy harvester detects distortion of the spring sleeve when the securement mechanism is engaged by the tool.

5. The method according to claim 1, wherein positive and negative leads are attached to the energy harvester.

6. The method according to claim 5, wherein the energy harvester transmits an electrical signal to an electronic component of the security tag.

7. The method according to claim 1, wherein the energy harvester comprises a coil and a permanent magnet that is coupled to the securement mechanism.

8. The method according to claim 7, wherein the permanent magnet moves past the coil so as to induce an electrical charge when the securement mechanism rotates as a result of the pushing force being applied thereto.

9. The method according to claim 8, wherein the electrical charge is transferred to an electronic component of the security tag so as to indicate that the securement mechanism has been engaged by the tool.

10. A security tag, comprising:
a securement mechanism disposed within the security tag so that the securement mechanism deforms when a pushing force is applied thereto by a tool, the securement mechanism comprising a spring sleeve to which mechanical energy is transferred when the securement mechanism deforms; and
an energy harvester at least partially directly coupled to the securement mechanism that harnesses the mechanical energy applied by the tool and converts the mechanical energy into electrical energy;
wherein the energy harvester comprises at least one of a piezo element, a magnet/solenoid element and a Micro-Electro-Mechanical-Systems ("MEMS") device.

11. The security tag according to claim 10, wherein the energy harvester is disposed between the securement mechanism and an Electronic Article Surveillance ("EAS") or Radio Frequency IDentification ("RFID") component of the security tag.

12. The security tag according to claim 10, wherein the energy harvester comprises a piezo element attached to the spring sleeve of the securement mechanism.

13. The security tag according to claim 10, wherein the energy harvester detects distortion of the spring sleeve when the securement mechanism is engaged by the tool.

14. The security tag according to claim 10, wherein positive and negative leads are attached to the energy harvester.

15. The security tag according to claim 14, wherein the energy harvester transmits an electrical signal to an electronic component of the security tag.

16. The security tag according to claim 10, wherein the energy harvester comprises a coil and a permanent magnet that is coupled to the securement mechanism.

17. The security tag according to claim 16, wherein the permanent magnet moves past the coil so as to induce an electrical charge when the securement mechanism rotates as a result of the pushing force being applied thereto.

18. The security tag according to claim 17, wherein the electrical charge is transferred to an electronic component of the security tag so as to indicate that the securement mechanism has been engaged by the tool.

* * * * *